United States Patent [19]

Pasterchick, Jr. et al.

[11] Patent Number: 4,677,527
[45] Date of Patent: Jun. 30, 1987

[54] COMPACT ELECTRICAL CONNECTION AND DISTRIBUTION SYSTEM FOR PLUGGABLE MODULAR DEVICES

[75] Inventors: Harry Pasterchick, Jr., Cary; Craig W. Turner, Raleigh, both of N.C.

[73] Assignee: International Business Machines Corp., Armonk, N.Y.

[21] Appl. No.: 628,938

[22] Filed: Jul. 9, 1984

[51] Int. Cl.⁴ .............................................. H05K 1/14
[52] U.S. Cl. ..................................... 361/395; 29/832; 439/327
[58] Field of Search ................ 200/51 R; 339/75 MP, 339/18 R, 18 B; 361/395, 399, 412, 413, 415; 29/832, 834, 836, 842, 845

[56] References Cited

U.S. PATENT DOCUMENTS

| | | | |
|---|---|---|---|
| 3,475,657 | 10/1969 | Knowles | 361/413 |
| 3,533,045 | 10/1970 | Henschen | 361/413 |
| 3,567,998 | 3/1971 | Ammerman | 361/399 |
| 3,609,464 | 9/1971 | Stone | 361/412 |
| 3,614,541 | 10/1971 | Farrand | 361/412 |
| 3,675,083 | 7/1972 | White | 361/413 |
| 4,076,362 | 2/1978 | Ichimura | 339/75 MP |
| 4,168,877 | 9/1979 | Little et al. | 361/413 |
| 4,266,839 | 5/1981 | Aikens | 339/75 MP |

FOREIGN PATENT DOCUMENTS 0107201 8/1979 Japan ................................ 361/395

*Primary Examiner*—A. D. Pellinen
*Assistant Examiner*—Greg Thompson
*Attorney, Agent, or Firm*—Joscelyn G. Cockburn

[57] ABSTRACT

A unique system for packing and distributing electrical signals within an electrical machine is disclosed. Electrical distributing circuit conductors are pre-printed or pre-plated directly onto the inside surface of the machine covers. A pluggable edge connector is provided for interfacing the plated electrical conductors with pluggable electrical devices or electrical cards. The connector is fitted with independently switchable contacts which allow a pluggable electrical device or card to be electrically coupled with a respective pre-plated/pre-printed conductor or a discrete wire conductor. As a result, changes in the distributing system can be made without changing the plated lands pattern on the machine covers.

7 Claims, 7 Drawing Figures

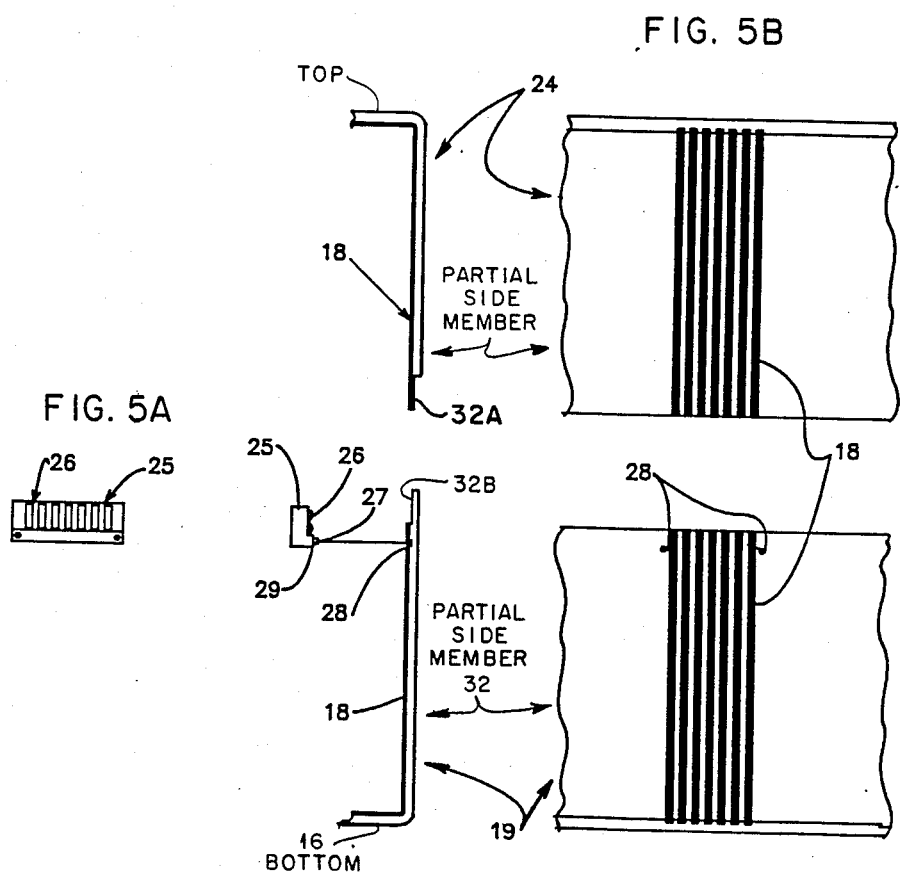

COMPACT ELECTRICAL CONNECTION AND DISTRIBUTION SYSTEM FOR PLUGGABLE MODULAR DEVICES

BACKGROUND OF THE INVENTION

1. Field of the Invention

The present invention relates to the distribution of electrical signals within a machine or the like.

2. Prior Art

A general prior art methodology used for packaging and distributing electrical signals, within electrical machines, consists of a circuit board upon which a plurality of circuits are placed. A plurality of edge connectors are used for electronically interfacing the circuits with other electronic components, such as modules. The circuit boards and attachments are mounted to the machine frames. Oftentimes electrical cables are used to complete the internal wiring of the machine. Covers are then placed on the machine frame. The covers hide the internals of the machine and provide a more aesthetic appearance.

The prior art describes several types of connectors for connecting modules to circuit boards. For example, U.S. Pat. Nos. 3,344,243; 3,475,657; 3,922,054; 4,266,839 and 4,386,815 disclose module connectors for interconnecting printed circuit conductors and input/output (I/O) pads of an edge-connected printed circuit board.

U.S. Pat. No. 4,203,642 exemplifies another type of prior art connector. The patent describes an adjustable card edge connector for electrically connecting a double-sided printed circuit card with discrete conductors.

U.S. Pat. No. 3,902,777 describes a connector block for electrically interconnecting a dual in-line plug module with the printed conductors on a substrate.

SUMMARY OF THE INVENTION

It is therefore the object of the present invention to provide a more efficient system for distributing electrical signals within an electrical machine.

It is another object of the present invention to provide a more efficient connector for interconnecting printed circuit electrical devices.

It is still another object of the present invention to provide a unique methodology for distributing electrical signals within a machine.

The unique methodology includes a distribution circuitry pre-printed or pre-plated onto the inside covers of the machine. Edge connectors are designed for snapping into the covers and to form an electrical interface between the pre-printed or pre-plated circuitry and pluggable electrical devices or cards. The edge connector is provided with independently switchable contacts which enable electrical communication between the pre-plated circuitry or the device and a non-printed electrical circuitry.

The foregoing features and advantages of the invention will be more fully described in the accompanying drawings.

BRIEF DESCRIPTION OF THE DRAWINGS

FIGS. 5A and 5B show a schematic of a interface for electrically interconnecting the cover sections of the machine.

DETAILED DESCRIPTION OF THE PREFERRED EMBODIMENT

Figure 1:
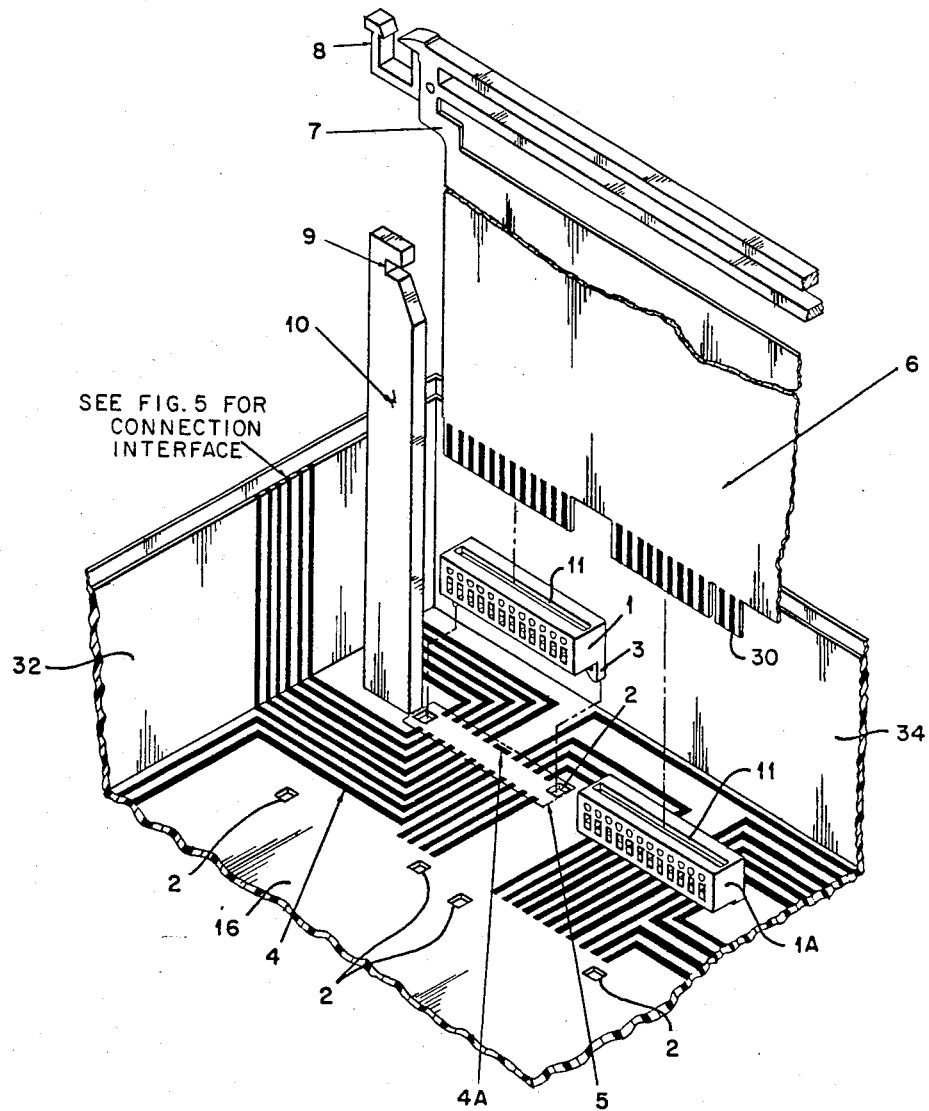
FIG. 1 shows a schematic of an electrical distributing system according to the teaching of the present invention.

FIG. 1 shows a partial view of an electrical machine whose electrical system is prepared according to the teaching of the present invention. The machine covers are comprised of bottom cover 16, partial side members 32 and 34, respectively. Electrical conductors identified by numeral 4 are pre-printed or pre-plated onto the inside surfaces of the machine. A conductor identified by numeral 4A which can be used as a jumper is also printed on the bottom surface of the machine. A plurality of retainer openings 2 are fabricated into bottom cover 16. As will be explained subsequently, the use of the retainer aperture is to seat the pluggable edge connector 1. In the figure the edge connector 1A is shown fitted into the opening. The edge connector 1 is shown displaced from the opening. A pair of beam latches, only one of which is shown and identified by numeral 3, are fabricated on each pluggable edge connector. The beam latches coact with the retainer openings to latch the connector firmly against the bottom cover 16.

The electrical connection between the connector and the circuitry occurs directly beneath the connector within the area identified by numeral 5. Preferably, the remaining area external to area 5 is pre-coated with an electrical insulated flame-retardant material to prevent accidental shorting or potential shock hazards during machine operation and servicing. Once the insulation material has been deposited a metallized coating may be plated, flame sprayed, or vacuum metallized over it to prevent electromagnetic interference or radio frequency interference. Preferably, the contact area 5 is masked off prior to the metallization deposition.

Still referring to FIG. 1, an elongated card guide 10 is snap fitted or molded into bottom cover 16. The upper extremity of the card guide is provided with a retainer seat identified by numeral 9. A card holder 7 is fitted with a snap latch 8. The snap latch 8 coacts with the retainer seat 9 to hold the electrical device 6 firmly into the edge connectors.

It should be noted that the pluggable device 6 may be a printer, power supply, logic package, etc. For simplicity, the only pluggable device described in the figure is a printed circuit card with a plurality of printed circuit conductors 30 deposited on the edge of the card. In assembling the machine the pluggable edge connector 1 is snap latched into retainer aperture 2. The offset beam latches 3 hold the edge connector firmly against the bottom cover of the machine. The pluggable device 6 is then fitted into slot 11 of the pluggable edge connector. The snap latch 8 latches into retainer seat 9 and holds the card firmly into the connector.

Figure 2:
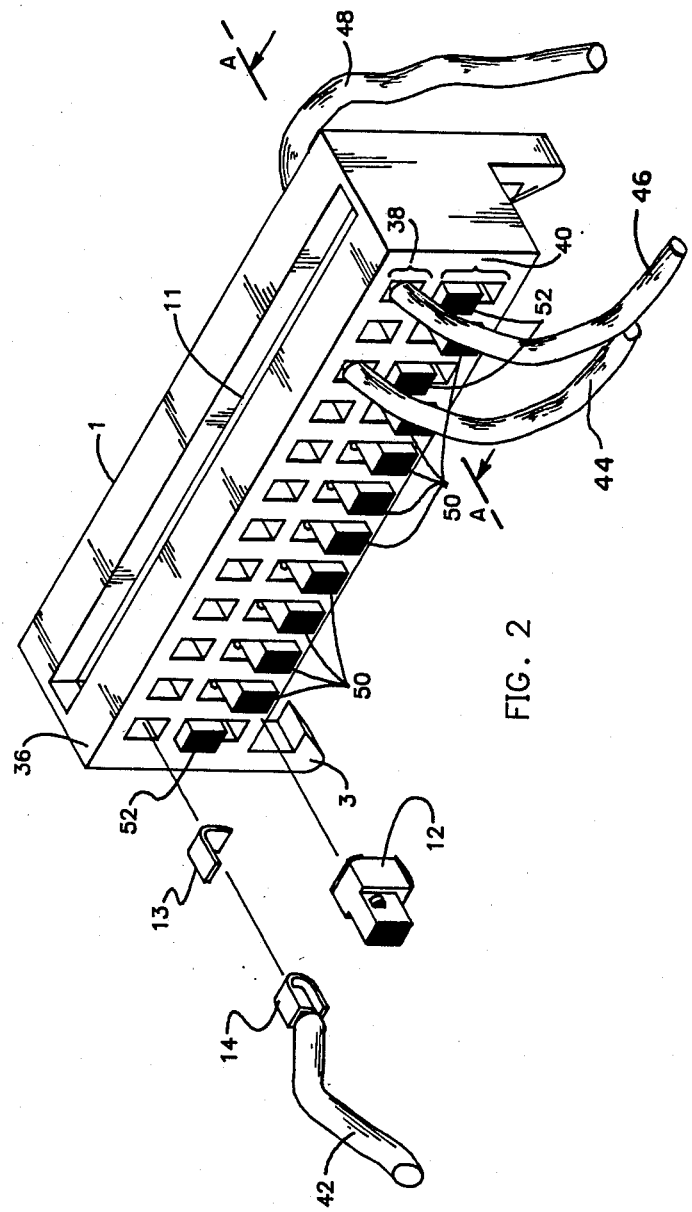
FIG. 2 shows a pictorial view of an edge connector according to the teachings of the present invention.

FIG. 2 shows an isometric view of the pluggable edge connector assembly. The connector assembly includes housing 1 with a slot 11. The slot serves as a receptacle for the pluggable device 6 (FIG. 1). The slot extends through the pluggable device from the top surface 36 to the bottom surface. As stated before, a pair of beam latches 3 are integrally molded on the bottom surface of the pluggable connector. The beam latches are snapped into retainer aperture 2 (FIG. 1) to hold the edge connector firmly against the bottom cover of the machine. Two rows of apertures identified by numerals 38 and 40, respectively, are integrally molded into the side of the housing. The aperture in each row is discrete and intersects the elongated slot. Each of the apertures in the top row 38 is fitted with a metal terminal contact 13 and functions as an electrical receptacle. An electrical conductive terminal 14 is crimped onto a conductive wire identified by numeral 42. The wire can then be plugged into the aperture and mates with the buried contact 13. The buried contact then coacts with discrete card edge conductor 30, FIG. 1 thereby enabling electrical communication between different electrical conductors. For example, in FIG. 2 electrical conductors 44 and 46 are shown plugged into respective apertures.

Figure 3:
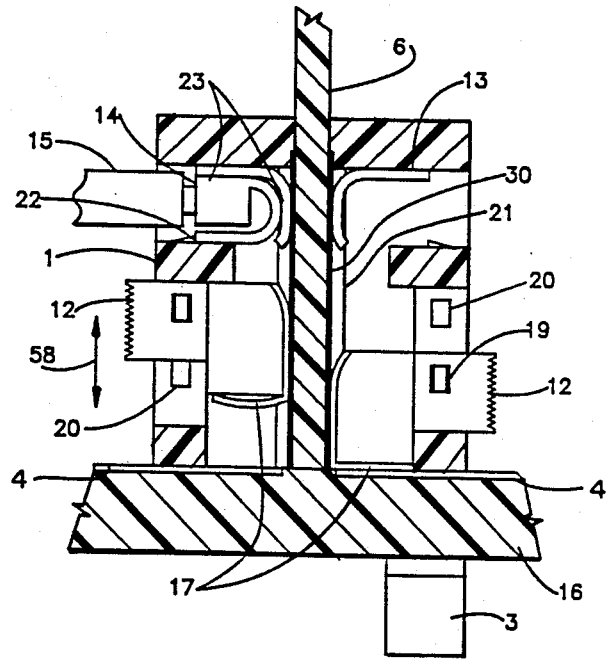
FIG. 3 shows a cross-section of the electrical distributing system.

Still referring to FIG. 2, the apertures in row 40 are each fitted with a slider switch 12. As will be explained subsequently, the slider switch is a two-position switch movable in the slide direction shown in FIG. 3. When it is in one position, say the down position 50, as is demonstrated in FIG. 2, slider spring contact 17 is in contact with conductors 30 and 4, respectively. In this position the electrical device 6 is in electrical communication with the circuit on the inside covers of the machine. Similarly, when the switch is in the up position as is demonstrated by the switches at location 52 (FIG. 2), the electrical communication is broken with conductor 4 (FIG. 3). If one desires, the terminated electrical wire 42 can then be plugged into one of the discrete openings in row 38 to form an electrical communication between the pluggable device and some other device. As a result of this feature, wire changes can be made without changing the plated lands or conductor pattern on the machine cover.

Figure 4A:
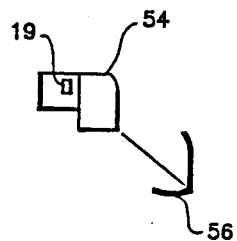
FIGS. 4A and 4B show a slider switching device.
Figure 4B:
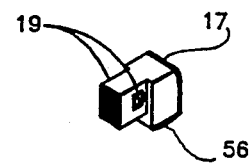

Referring to FIGS. 4A and 4B for the moment, the details of the vertical slider switch are shown. The switch comprises of a plastic slider housing 54. Spring clip 19 protrudes from both sides of the slider housing. The function of the spring clip is to hold the switch firmly in one of its selected positions. A metal slider spring contact 17 is attached to the front surface of the plastic slider housing. The lower surface 56 of the metal slider spring contact 17 is fabricated with a slight bow. As will be explained subsequently, when the switch is in the down position (FIG. 3), the bow disappears and provides added pressure between the slider spring contact and the electrical land patterns on the bottom surface of the machine.

FIG. 3 shows a cross section of the pluggable connector with a pluggable device therein attached to the bottom cover 16. The cross section is helpful in understanding the operation of the connector system. The connector housing/assembly 1 is snapped into the plastic bottom cover 16 and is retained by beam latches 3. The pluggable device 6 is plugged into the connector housing 1 and is self-aligned by means of a molded slot 21. The pluggable device is retained by the frictional engagement of the connector 1 and by the existing card latches previously described in FIG. 1. Two connection possibilities are provided. One of the connection possibilities is shown on the right-hand side of the pluggable device 6; the other is shown on the left-hand side.

On the right-hand side, the switch 12 is in the down position and a circuit conductor 4 disposed on the inner surface of bottom cover 16 of the machine is in contact with edge conductor 30 on the card. As stated previously, the circuit conductor 4 is overcoated with an insulation material except in the area of contact with the slider contact 17. The slider switch 12 is held in the lower position with the metal spring 19 which engages into a detent 20. The bow which is fabricated in slider spring contact 17 disappears and as a result the electrical connection between the slider switch 17 and the conductor 4 is enhanced. It should also be noted that although the wire terminal 13 is always in contact with the card edge conductor 30 it is inoperative since it is not coupled to a wire or electrical conductor. In other words, the metal terminal contact 13 is always in contact with the card edge conductor 30. However, until a conducting wire is forced into one of the apertures 38 to make contact with the buried metal terminal contact 13 it remains inactive or inoperative.

Still referring to FIG. 3, the other possibility occurs when the slider contact 12 is moved upwardly (direction of travel is shown by the slide direction 58). The second possibility is shown on the left-hand side of printed circuit card 6. The slider switch 12 is pushed to the upper position with the metal spring 19 engaging the upper detent 20. Moving the slider switch to its upper position breaks the connection between the circuit conductor 4 and the card edge conductor 30. It should be noted that when the slider switch is in the upper position the spring is in a relaxed state and the bow 56 appears.

When the switch is in the inoperative position, a discrete electrical wire such as 44, 46 or 48 can be placed into contact with the card edge connector 30. To achieve this connection the wire is inserted into one of the upper apertures 38 and the wire crimp terminal 14 is brought into contact with conductor 30 via the buried metal terminal contact 13. This electrically connects the terminated wire to the card edge conductor 30. The terminated wire 15 (FIG. 3) is held in place by plastic retainer tab 22. The plastic retainer tab 22 is an integral part of the connector housing 1. The terminal 14 has two contact points 23 with the metal terminal 13. The terminated wire 15 can be removed by inserting a tool (not shown) and depressing the retainer tab 22 and pulling the wire 15 out of the connector housing 1.

FIGS. 5A and 5B are schematics showing how the top cover section 24 mates with bottom cover section 19. Top cover section 24 includes an integral top section and partial side section. Likewise, bottom cover section 19 includes bottom cover 16 and partial side section 32. A plurality of electrical conductors identified by numeral 18 are deposited on the inside surface of top cover section 24 and bottom cover section 19. In order to bring these conductors into conductive contact a plastic connector 25 with a plurality of metal spring contacts 26 is mounted on bottom cover 16. In the preferred embodiment of this invention a plurality of spaced guide pin holes 28 are placed into the partial side member 32. The plastic connector 25 is fabricated with a spacer section 29 and a plurality of space guide pins 27 mounted on the spacer section. In assembling, the guide pins 27 are fitted into pin holes 28. The spacer member 29 forms a control opening between the conductors in the partial side member 32 and the metal spring contacts 26. Next, the top cover section 24 is simply assembled by mating notch 32A (top cover section) with notch 32B (bottom cover section). The conductors 18 on top cover section 24 are automatically positioned into the control opening (that is a space formed by the connector 25 and the inside surface of the bottom cover section 19). The metal springs on connector 25 bridges the conductors 18 on the bottom and top cover sections, thus completing the electrical circuit. There are several advantages when a machine is assembled according to the teaching of the present invention. Among the advantages are costly and bulky cable assemblies are eliminated by pre-printed or pre-plated circuitry.

Also, eliminating cables and their associated part numbers greatly reduces the size and cost of a machine's billed structure.

Electrical connection between the cover sections is automatic upon assembling the two halves.

As compared to standard pluggable cable connections which are subject to movement and wear vibration, the described invention has vibration-proof connections.

Card or pluggable device polarization can be integrally molded into the card edge connector.

Wiring or circuit changes or switching are easily made by moving the slider switch up and inserting the terminated wire into the pluggable edge connector.

The pluggable device is aligned by integrally molded slots inside the pluggable edge connector and is securely retained by a conventional snap latch of the card holder.

Conventional jumpers can be eliminated by pre-plating or pre-painting the jumpers on the inside surface of the machine.

While the invention has been particularly shown and described with reference to the preferred embodiments thereof, it will be understood by those skilled in the art that various change in form and details may be made therein without departing from the spirit and scope of the invention.

Having thus described our invention, what we claim as new, and desire to secure by Letters Patent is:

1. An improved system for distributing electrical signals within an electrical machine comprising:
   a set of covers operable for covering the internal components of said machine;
   one or more distributing electrical conductors pre-printed and/or pre-plated onto the inside surface of the covers;
   an edge connecting means coupled to a cover; said edge connecting means having an elongated slot therein;
   a pluggable card carrying a plurality of electrical devices mounted in said slot; said pluggable card having a plurality of edge conductors thereon;
   discrete switching means coupled to the edge connecting means and movable between a first position whereat the pluggable card is placed into electrical communication with the pre-printed and/or pre-plated conductors and a second position whereat the electrical communication is being discontinued.

2. The improved system of claim 1 further including a row of discrete apertures disposed on a side surface of the edge connecting means;
   a terminal contact means disposed in each aperture;
   said terminal contact means being in electrical contact with the edge conductors; and
   one or more electrical conductors carrying wire terminals thereon and operable for inserting in the apertures to contact the terminal contact means thereby forming an electrical conductive path between the conductor and the pluggable card.

3. The improved system of claim 2 further including a guide rail connected to a cover and operable for positioning the pluggable card relative to pre-selected zones on the cover.

4. The improved system recited in claim 3 further including holding means operable for coacting with the guide rail to hold the pluggable card firmly in place.

5. An improved edge connector interconnecting a circuit card carrying electrical devices between a plurality of conductors disposed on a cover surface and a plurality of discrete conductors comprising:
   a housing member having an elongated slot disposed in one surface accommodating the circuit card;
   a plurality of discrete apertures disposed in another surface; said plurality of discrete apertures intersecting with the elongated slot;
   terminal contact means one of each being embedded in each of the discrete apertures and operable to interconnect the surface of the circuit card with one of the discrete conductors; and
   at least one switching means mounted in said plurality of discrete apertures with a deformable conductive electrical member connected thereto; said switching means being operable to be moved in a first position bringing the deformable conductive electrical member into contact with conductive strips on said circuit card and one of the plurality of conductors on the cover surface and being operable to be moved in a second position disconnecting the conductive strip from the conductors on the cover surface.

6. A method for packaging an electrical distribution system within a machine comprising the steps of:
   (a) placing a plurality of planar electrical conductors on the inside surface of machine covers said conductors interconnecting selected sites on said covers;
   (b) providing at each of the selected sites a connector means having a slot therein and a movable assembly;
   (c) inserting a pluggable card into the slot; said card supporting a plurality of electrical devices and having edge conductors thereon; and
   (d) positioning the movable assembly whereby a conductive element on said assembly is made to contact the edge conductors and the planar conductors.

7. An improved connector block interconnecting electrical conductors printed on a circuit board carrying a plurality of electrical devices with electrical conductors printed on a supporting substrate comprising:
   a housing member having an elongated slot disposed in one surface accommodating the circuit board;
   one or more discrete apertures disposed in another surface; said one or more discrete apertures intersecting with the elongated slot;
   independently activated switching means mounted in said one or more discrete apertures with a deformable conductive electrical member connected thereto; said switching means being operable to be placed in a first position whereat the deformable conductive electrical member interconnects the electrical conductors on the circuit board with the conductors on the supporting substrate to form a conductive path therebetween and being operable to be placed in a second position whereat the electrical conductive path is being disconnected.

* * * * *